(12) United States Patent
Draper

(10) Patent No.: US 6,285,052 B1
(45) Date of Patent: *Sep. 4, 2001

(54) INTEGRATED CAPACITOR

(75) Inventor: Donald A. Draper, San Jose, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/939,017

(22) Filed: Sep. 26, 1997

(51) Int. Cl.$^7$ .................... H01L 27/108; H01L 29/76; H01L 29/94; H01L 31/119
(52) U.S. Cl. ............................. 257/300; 257/532
(58) Field of Search .................... 257/300, 296, 257/532

(56) References Cited

U.S. PATENT DOCUMENTS

| | | | |
|---|---|---|---|
| 4,670,669 | * | 6/1987 | Cottrell et al. ............... 307/297 |
| 5,576,565 | * | 11/1996 | Yamaguchi et al. ............ 257/296 |
| 5,608,258 | * | 3/1997 | Rajkanan et al. .............. 257/532 |
| 5,793,074 | * | 8/1998 | Choi et al. ................... 257/296 |

OTHER PUBLICATIONS

K. Ng, "Complete Guide to Semiconductor Devices," McGraw–Hill, Inc., New York, 1995, pp. 121–131.

* cited by examiner

Primary Examiner—Ngân V. Ngô
(74) Attorney, Agent, or Firm—Skjerven Morrill MacPherson LLP; John Odozynski

(57) ABSTRACT

An integrated capacitor includes a device region of first conductivity type in a semiconductor substrate, a source/drain region of the first conductivity type in the device region with a higher doping concentration than the device region, a gate insulator over the device region, and a gate over the gate insulator. A first terminal is coupled to the source/drain region, and a second terminal is coupled to the gate. Advantageously, the integrated capacitor is operated with the device region beneath the gate driven into accumulation instead of inversion. This allows a lower voltage to be applied to the gate, which allows for a thinner gate insulator to be used resulting in higher capacitance per unit area. Furthermore, since the device region is much thicker and more highly conductive than an inversion layer, the integrated capacitor has greatly improved frequency response.

21 Claims, 5 Drawing Sheets

INTEGRATED CAPACITOR

BACKGROUND OF THE INVENTION

1. Field of the Invention

The present invention relates to electronic components, and more particularly to integrated capacitors.

2. Description of Related Art

Integrated capacitors refer to capacitors built on integrated circuits. Integrated capacitors are used for several reasons. One reason is to provide compensation capacitance for an operational amplifier in order to roll off high frequency response for stability purposes. A second reason is to provide a large amount of capacitance between signals. A third reason is to provide a large amount of capacitance between a signal and a power supply or ground. A fourth reason is to provide a large amount of capacitance between power supplies or between a power supply and ground. These types of capacitors are known as decoupling capacitors.

Integrated capacitors are often implemented as parallel-plate capacitors using vertically displaced conducting layers such as metal-1 and metal-2, metal-1 and polysilicon used for the gate material in a CMOS process, or conducting layers in a bipolar process. Integrated capacitors are also implemented as junction capacitors using reverse-biased PN junctions. Furthermore, integrated capacitors are implemented as MOS transistor capacitors, with the gate providing one plate and an inversion layer in the channel providing the other. These techniques are further described below.

FIG. 1 shows a cross-sectional view of conventional parallel-plate capacitor 10 which includes conductive layer 12, conductive layer 14, and dielectric layer 16 therebetween. Conductive layers 12 and 14 provide the capacitive plates, and dielectric layer 16 provides the dielectric therebetween. Capacitor 10 is disposed over semiconductor substrate 18. Terminals 20 and 22 are depicted schematically and coupled to conductive layers 12 and 14, respectively. Conductive layers 12 and 14 and dielectric layer 16 can be a wide variety of materials. For instance, conductive layers 12 and 14 can be metal, in which case capacitor 10 forms a metal-metal capacitor. Conductive layer 12 can be metal and conductive layer 14 can be polysilicon, in which case capacitor 10 forms a metal-polysilicon capacitor. In addition, conductive layers 12 and 14 can be polysilicon, in which case capacitor 10 forms a polysilicon-polysilicon capacitor. The dielectric is typically silicon dioxide. For instance, a thin oxide layer can be deposited or thermally grown between polysilicon layers. Metal-metal and metal-polysilicon capacitors provide good frequency response because the capacitive plates are relatively highly conductive and therefore provide a low RC product for low impedance at high frequency. However, metal-metal and metal-polysilicon capacitors require a large amount of chip area for a relatively small amount of capacitance due to the thick dielectric layer between the conductive layers. Polysilicon-polysilicon capacitors provide moderately high capacitance per unit area, and in addition, the polysilicon layers can be heavily doped to provide moderately good conductivity in the capacitive plates for a medium level of frequency response. However, it is difficult to form a thin oxide of high quality between the polysilicon layers due to surface roughness of the polysilicon.

FIG. 2 shows a cross-sectional view of conventional junction capacitor 30 that includes N+ heavily doped region 32 in P− device region 34, such as a P-well in a semiconductor substrate. Capacitor 30 also includes positive terminal 36 depicted schematically and coupled to heavily doped region 32, and negative terminal 38 depicted schematically and coupled to device region 34. A drawback to capacitor 30, however, is that the depletion layer separating heavily doped region 32 and device region 34 might not be thin enough to provide the desired capacitance. Although providing heavily doped region 32 with extremely high doping leads to a thinner depletion region, it also decreases the breakdown voltage, increases voltage dependence, and results in relatively resistive capacitive plates with poor frequency response.

FIGS. 3, 4 and 5 show a schematic diagram, a cross-sectional view, and a top plan view, respectively, of conventional N-channel MOS transistor capacitor 40. As is seen, capacitor 40 includes P− device region 42, such as a P-well in a P− semiconductor substrate. Capacitor 40 also includes oxide layer 44 on a central portion of device region 42, N+ polysilicon gate 46 on oxide layer 44, N− lightly doped source/drain region 48 in device region 42 and outside and aligned with the sidewalls of polysilicon gate 46, oxide spacer 50 over lightly doped source/drain region 48 and adjacent to the sidewalls of polysilicon gate 46, and N+ heavily doped source/drain region 52 in device region 42 and outside and aligned with the outer edges of oxide spacer 50. Capacitor 40 also includes positive terminal 54 depicted schematically and coupled to polysilicon gate 46, and negative terminal 56 depicted schematically and coupled to heavily doped source/drain region 52 and to P+ well tap 58 in device region 42. Terminals 54 and 56 are coupled to polysilicon gate 46, heavily doped source/drain region 52 and well tap 58 through conductive vias 60, 62 and 64, respectively, in contact holes of a dielectric layer (not shown). For convenience of illustration, other conductive vias and dielectric isolation between adjacent device regions are not shown.

FIGS. 6, 7 and 8 show a schematic diagram, a cross-sectional view, and a top plan view, respectively, of conventional P-channel MOS transistor capacitor 70. As is seen, capacitor 70 includes N− device region 72, such as an N-well in a P− semiconductor substrate. Capacitor 70 also includes oxide layer 74 on central portion of device region 72, P+ polysilicon gate 76 on oxide layer 74, P− lightly doped source/drain region 78 in device region 72 and outside and aligned with the sidewalls of polysilicon gate 76, oxide spacer 80 over lightly doped source/drain region 78 and adjacent to the sidewalls of polysilicon gate 76, and P+ heavily doped source/drain region 82 in device region 72 and outside and aligned with the outer edges of oxide spacer 80. Capacitor 70 also includes positive terminal 84 depicted schematically and coupled to heavily doped source/drain region 82 and to P+ well tap 88 in device region 72, and negative terminal 86 depicted schematically and coupled to polysilicon gate 76. Terminals 84 and 86 are coupled to polysilicon gate 76, heavily doped source/drain region 82 and well tap 88 through conductive vias 90, 92 and 94, respectively, in contact holes of a dielectric layer (not shown). For convenience of illustration, other conductive vias and dielectric isolation between adjacent device regions are not shown.

During the operation of transistor capacitors 40 and 70, the voltage applied to the positive terminal is greater than the voltage applied to the negative terminal, and the voltage drop between the positive and negative terminals modulates the net carrier concentration in the channel to create an inversion layer in the channel (the classical enhancement-mode field effect). This biases the transistor in the triode region, with the gate providing one plate and the inversion layer providing the other.

A problem which arises in N-channel transistor capacitor 40 is that the voltage across the gate oxide is relatively high due to the Fermi level difference between the gate and the substrate. Although P-channel transistor capacitor 70 has the same Fermi potential problem, a further problem is that the gate is biased negatively with respect to the substrate in order to cause inversion, and since the bottom of a polysilicon gate tends to be rough relative to the smooth surface of the single-crystal silicon substrate, electrons are more easily emitted from the points of the roughness due to the field enhancement at the tips. This significantly degrades the voltage-bearing capacity of the gate oxide, requiring a thicker gate oxide with consequently lower capacitance.

Moreover, both capacitor 40 and capacitor 70 have relatively high resistance in the inversion layer, which limits frequency response. In addition, these capacitors have a limited breakdown voltage, or alternatively, the lifetime of the gate oxide with reference to Time-Dependent Dielectric Breakdown (TDDB) is low.

Accordingly, a need exists for an improved integrated capacitor.

SUMMARY OF THE INVENTION

The present invention provides an improved integrated capacitor. Generally speaking, this is accomplished using an MOS transistor capacitor with the source/drain region in a device region of the same conductivity type.

In accordance with one aspect of the invention, an integrated capacitor includes a device region of first conductivity type in a semiconductor substrate, a source/drain region of the first conductivity type in the device region with a higher doping concentration than the device region, a gate insulator over the device region, and a gate over the gate insulator. A first terminal is coupled to the source/drain, and a second terminal is coupled to the gate.

Preferably, the source/drain region includes lightly doped regions aligned with sidewalls of the gate, and heavily doped regions aligned with spacers adjacent to the sidewalls of the gate. It is also preferred that the first conductivity type is N-type, the gate is polysilicon, and the gate insulator is silicon dioxide.

Advantageously, the integrated capacitor is operated with device region beneath the gate driven into accumulation instead of inversion. This allows a lower voltage to be applied to the gate, which allows for a thinner gate insulator to be used resulting in higher capacitance per unit area. Furthermore, since the device region is much thicker and more highly conductive than an inversion layer, the integrated capacitor has greatly improved frequency response.

These and other objects, features and advantages of the invention will be further described and more readily apparent from a review of the detailed description of the preferred embodiments which follows.

DETAILED DESCRIPTION OF THE PREFERRED EMBODIMENTS

Figure 1:
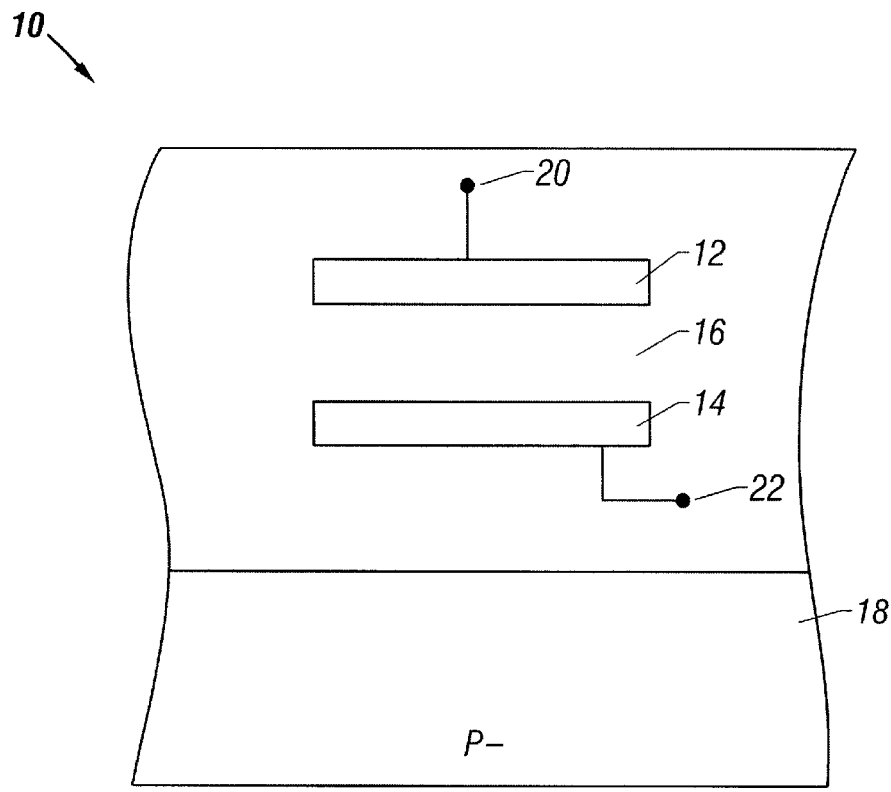
FIG. 1 is a cross-sectional view of a conventional parallel-plate capacitor.
Figure 2:
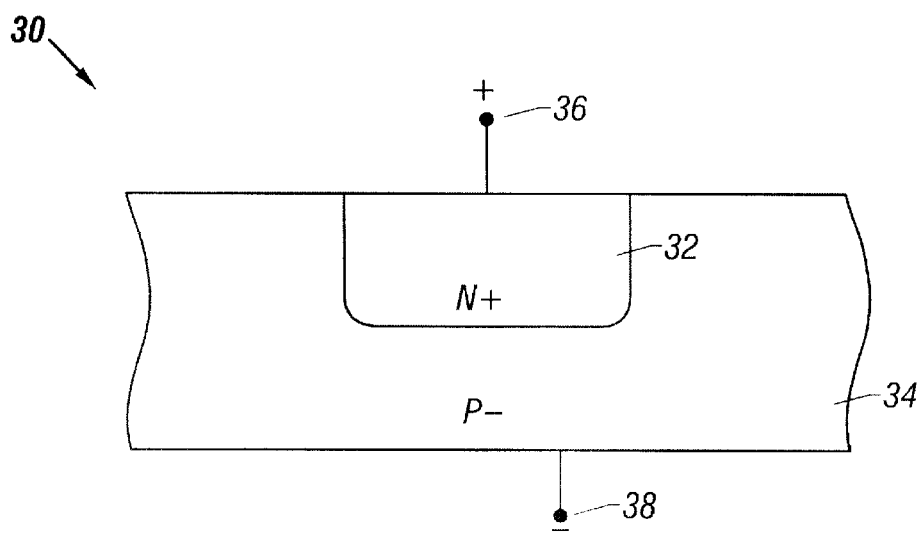
FIG. 2 is a cross-sectional view of a conventional junction capacitor.
Figure 3:
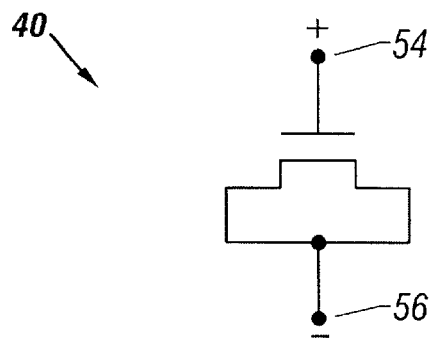
FIGS. 3, 4 and 5 are a schematic diagram, a cross-sectional view, and a top plan view of a conventional N-channel transistor capacitor.
Figure 4:
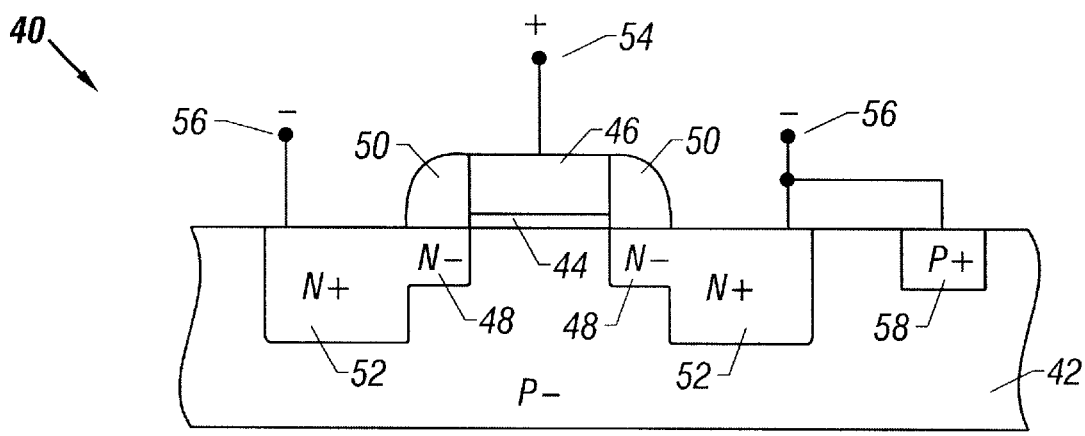
Figure 5:
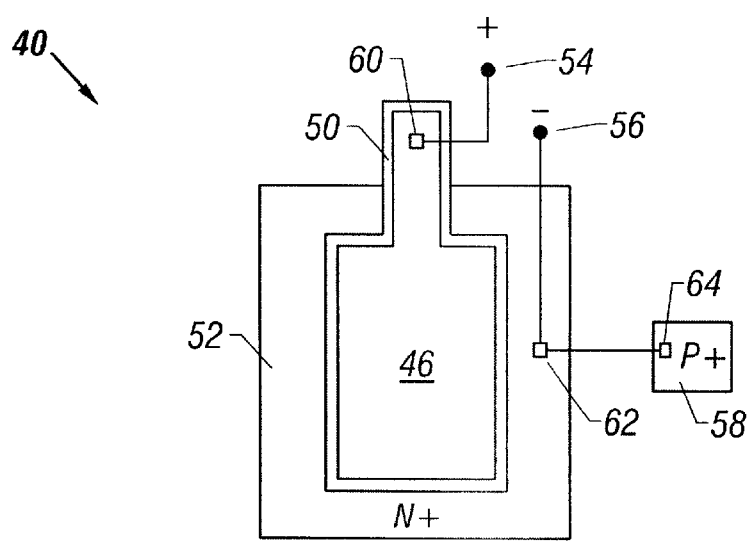
Figure 6:
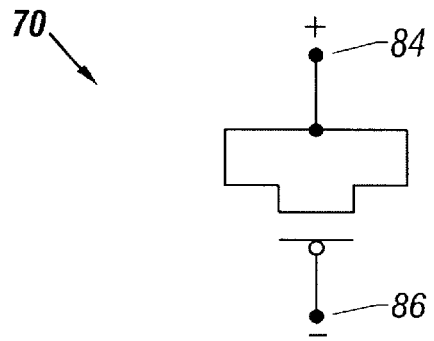
FIGS. 6, 7 and 8 are a schematic diagram, a cross-sectional view, and a top plan view of a conventional P-channel transistor capacitor.
Figure 7:
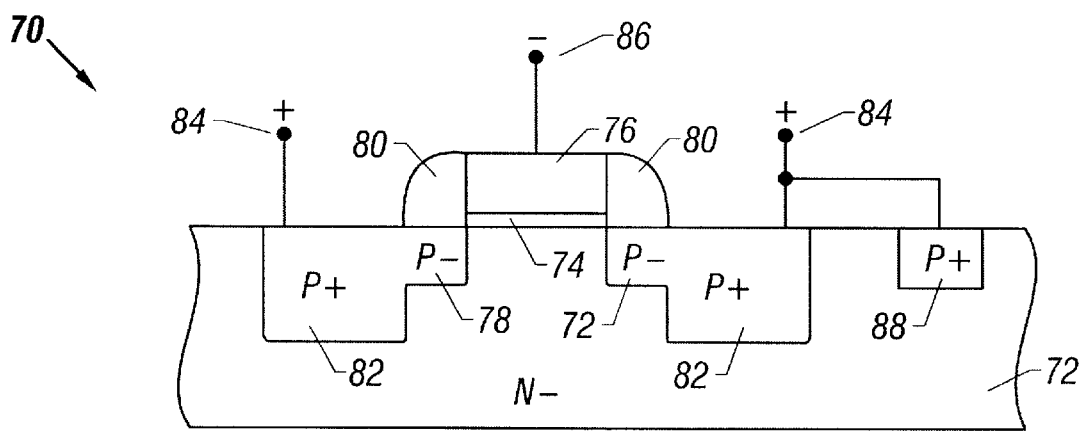
Figure 8:
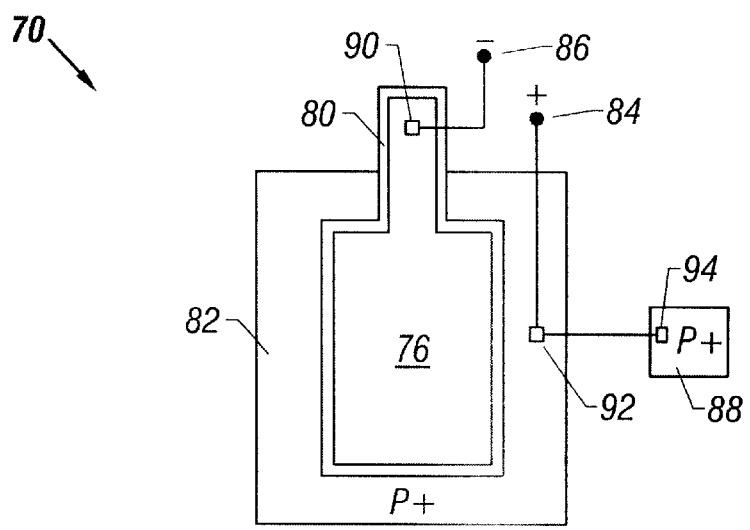
Figure 9:
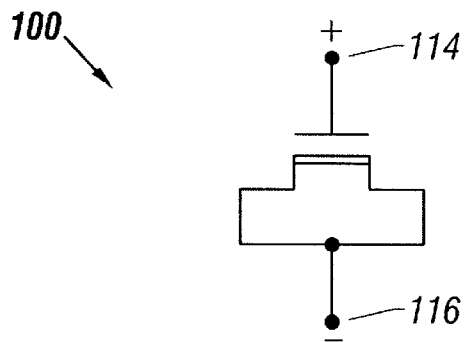
FIGS. 9, 10 and 11 are a schematic diagram, a cross-sectional view, and a top plan view of an N-channel transistor capacitor in accordance with an embodiment of the invention.
Figure 10:
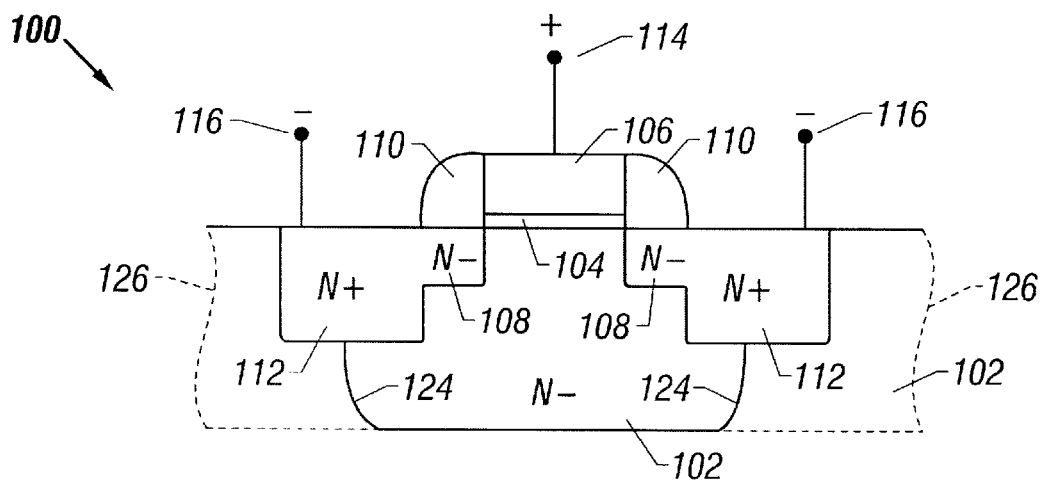
Figure 11:
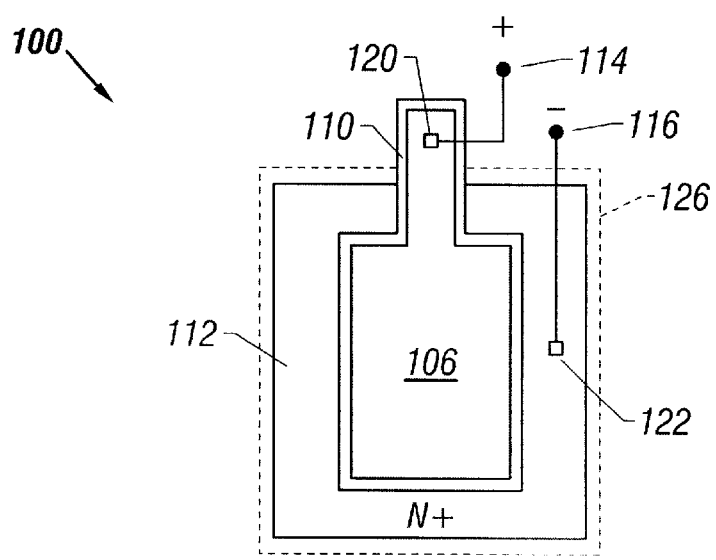

FIGS. 9, 10 and 11 show a schematic diagram, a cross-sectional view, and a top plan view, respectively, of N-channel MOS transistor capacitor 100 in accordance with an embodiment of the invention. As is seen, capacitor 100 includes N− device region 102, such as an N-well in a P− semiconductor substrate. Capacitor 100 also includes oxide layer 104 on a central portion of device region 102, N+ polysilicon gate 106 on oxide layer 104, N− lightly doped source/drain region 108 outside and aligned with the sidewalls of polysilicon gate 106, oxide spacer 110 over lightly doped source/drain region 108 and adjacent to the sidewalls of polysilicon gate 106, and N+ heavily doped source/drain region 112 outside and aligned with the outer edges of oxide spacer 110. Capacitor 100 also includes positive terminal 114 depicted schematically and coupled to polysilicon gate 106, and negative terminal 116 depicted schematically and coupled to heavily doped source/drain region 112. A separate N-well tap is unnecessary since device region 102 is biased at the same potential as heavily doped source/drain region 112. Terminals 114 and 116 are coupled to polysilicon gate 106 and heavily doped source/drain region 112, respectively, through conductive vias 120 and 122, respectively, in contact holes of a dielectric layer (not shown). For convenience of illustration, other conductive vias and dielectric isolation between adjacent device regions are not shown.

As one configuration, the outer boundary of device region 102 is depicted by solid lines 124, and heavily doped source/drain region 112 includes portions opposite to polysilicon gate 106 that extend outside device region 102 and contact the substrate. As another configuration, the outer boundary of device region 102 is depicted by broken lines 126, and all of heavily doped source/drain region 112 is within device region 102.

Polysilicon gate 106 provides one plate for capacitor 100 and device region 102 beneath polysilicon gate 106 forms the other. During operation, the voltage applied to positive terminal 114 is greater than the voltage applied to the negative terminal 116. For instance, terminal 114 is coupled to the power supply voltage, and terminal 116 is coupled to ground or the most negative potential. This increases the net carrier concentration in device region 102 beneath polysilicon gate 106, thereby forming an accumulation layer at the surface of device region 102 beneath polysilicon gate 106 and decreasing the resistance of the bottom plate of capacitor 100. Of importance, this is accomplished without forming an inversion layer in device region 102. Furthermore, the conductivity of device region 102 beneath the accumulation layer is in parallel with the accumulation layer. This results in a highly reliable capacitor (with respect to TDDB) with a very high frequency response.

Figure 12:
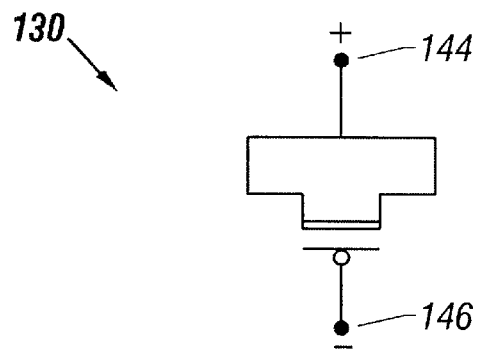
FIGS. 12, 13 and 14 are a schematic diagram, a cross-sectional view, and a top plan view of a P-channel transistor capacitor in accordance with an embodiment of the invention.
Figure 13:
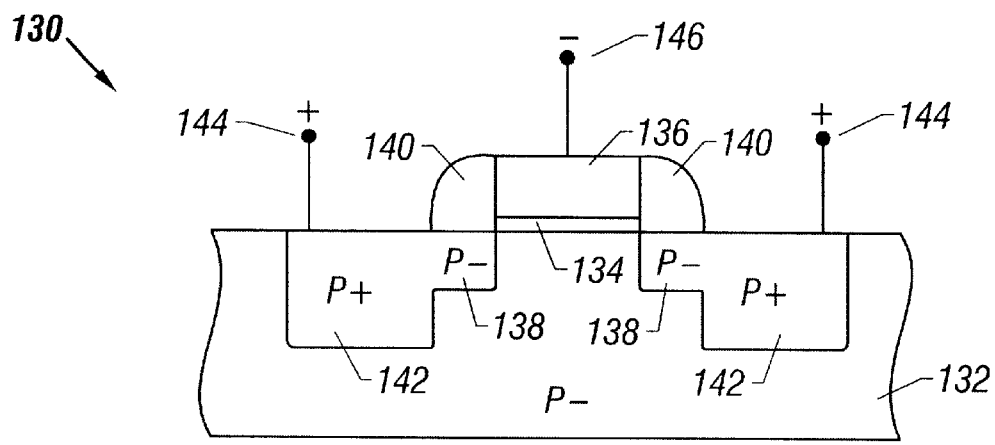
Figure 14:
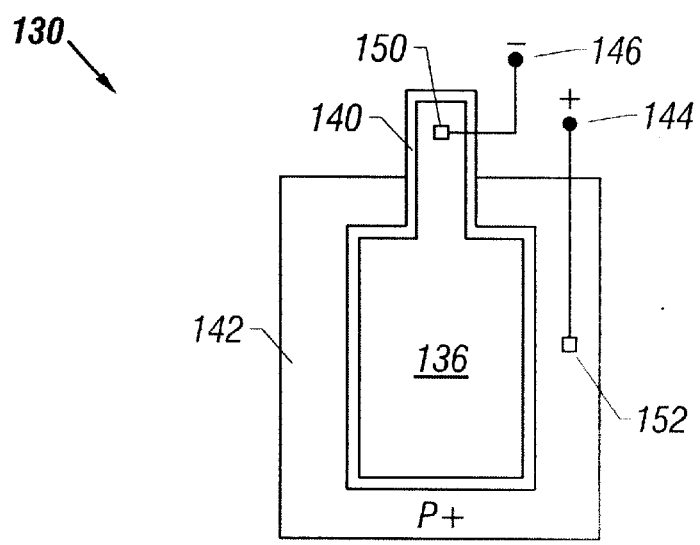

FIGS. 12, 13 and 14 show a schematic diagram, a cross-sectional view, and a top plan view, respectively, of P-channel MOS transistor capacitor 130 in accordance with an embodiment of the present invention. As is seen, capacitor 130 includes P− device region 132, such as a P-well in a P− semiconductor substrate. Capacitor 130 also includes oxide layer 134 on central portion of device region 132, P+ polysilicon gate 136 on oxide layer 134, P− lightly doped source/drain region 138 surrounded by device region 132 and outside and aligned with the sidewalls of polysilicon gate 136, oxide spacer 140 over lightly doped source/drain region 138 and adjacent to the sidewalls of polysilicon gate 136, P+ heavily doped source/drain region 142 surrounded by device region 132 and outside and aligned with the outer edges of oxide spacer 140. Capacitor 130 also includes positive terminal 144 depicted schematically and coupled to heavily doped source/drain region 138, and negative terminal 146 depicted schematically and coupled to polysilicon gate 136. A separate P-well tap is unnecessary since device region 132 is biased at the same potential as heavily doped source/drain region 142. Terminals 144 and 146 are coupled to polysilicon gate 136 and heavily doped source/drain region 142, respectively, through conductive vias 150 and 152, respectively, in contact holes of a dielectric layer (not shown). For convenience of illustration, other conductive vias and dielectric isolation between adjacent device regions are not shown.

Polysilicon gate 136 forms one plate and device region 132 beneath polysilicon gate 136 forms the other. During operation, the voltage applied to positive terminal 144 is greater than the voltage applied to the negative terminal 146. For instance, terminal 144 is coupled to a 3.3 volt supply voltage, and terminal 146 is coupled to ground. This increases the net carrier concentration in device region 132 beneath polysilicon gate 136, thereby forming an accumulation layer at the surface of device region 132 beneath polysilicon gate 136 and decreasing the resistance of the bottom plate of capacitor 130. Of importance, this is accomplished without forming an inversion layer in device region 132. Furthermore, the conductivity of device region 132 beneath the accumulation layer is in parallel with the accumulation layer. This results in a highly reliable capacitor (with respect to TDDB) with a very high frequency response.

In order to drive the device region 132 into accumulation, polysilicon gate 136 must be negative with respect to device region 132, which may be difficult since the semiconductor substrate is usually at ground or the most negative potential in most applications. Polysilicon gate 136 can be biased close to ground, however, and a capacitor can still be formed.

Capacitors 100 and 130 are fabricated using conventional CMOS technology. For instance, the substrate includes an epitaxial surface layer with a boron background concentration on the order of $1\times10^{15}$ atoms/cm$^3$, a <100> orientation and a resistivity of 12 ohm-cm. Device regions 102 and 132 are formed during the well-implant steps and have arsenic and boron background concentrations, respectively, on the order of $1\times10^{16}$ atoms/cm$^3$. Gate oxides 104 and 134 are grown using tube growth at a temperature of 700 to 1000° C. in an $O_2$ containing ambient to a thickness of about 50 angstroms. Polysilicon gates 106 and 136 are initially deposited as a blanket layer of polysilicon with a thickness of about 2000 angstroms, then patterned using photolithography and an etch step. Thereafter, lightly doped source/drain regions 108 and 138 are implanted during LDD implant steps of phosphorus and boron, respectively, using polysilicon gates 106 and 136 as implant masks for device regions 102 and 132, respectively. Lightly doped source/drain regions 108 and 138 have doping concentrations on the order of $1\times10^{17}$ to $1\times10^{18}$ atoms/cm$^3$. Next, a blanket layer of silicon dioxide is deposited by plasma-enhanced chemical vapor deposition, and an anisotropic reactive ion etch is applied to form oxide spacers 110 and 140. Thereafter, heavily doped source/drain regions 112 and 142 are implanted during implant steps of arsenic and boron, respectively, using polysilicon gate 106 and oxide spacers 110 as an implant mask for device region 102, and using polysilicon gate 136 and oxide spacers 140 as an implant mask for device region 132. Heavily doped source/drain regions 112 and 142 have doping concentrations on the order of $1\times10^{18}$ to $1\times10^{20}$ atoms/cm$^3$. The device is then subjected to a rapid thermal anneal on the order of 950 to 1050° C. for 10 to 30 seconds to drive-in and activate the implanted dopants. Finally, an interlevel dielectric is deposited over the structure, contact holes are etched, conductive vias are formed in the contact holes to contact polysilicon gates 106 and 136 and heavily doped source/drain regions 112 and 142, and conductive metal terminals (such as metal-1 lines) are connected to the conductive vias.

The integrated capacitor of the present invention has many applications in digital, analog and mixed-signal circuits. For example, it provides an excellent frequency decoupling capacitor for very high frequency analog and digital circuits. In comparison to chip capacitors mounted on the package, the integrated capacitor of the present invention has much lower inductance in the path to the gates on the chip which are switching. This has two key advantages. First, it provides higher frequency decoupling capacitance for high switching speed of the gates. Second, it provides a very low inductance path to ground for very high frequency components generated by such circuits as clock drivers which contribute to undesirably high Electromagnetic Interference (EMI).

Other variations and modifications of the embodiments disclosed herein may be made based on the description set forth herein without departing from the scope and spirit of the invention as set forth in the following claims.

What is claimed is:

1. An integrated capacitor comprising:
  a gate, the gate forming a first capacitor plate;
  a gate insulator disposed under the gate;
  a device region of a predetermined conductivity type, the device region disposed under the gate insulator so that at least a portion of the device region is contiguous to the gate insulator;
  a source/drain region of the predetermined conductivity type, the source/drain region having a doping concentration that is higher than the doping concentration of the device region; and
  an accumulation layer at a surface of the device region, the accumulation layer forming a second capacitor plate.

2. The integrated capacitor of claim 1, further comprising a first terminal coupled to the source/drain region and a second terminal coupled to the gate.

3. The integrated capacitor of claim 1, further comprising spacers formed adjacent to the sidewalls of the gate, wherein the source/drain region includes a lightly doped region aligned with sidewalls of the gate and a heavily doped region aligned with spacers.

4. The integrated capacitor of claim 1, wherein the source/drain region is surrounded by the device region.

5. The integrated capacitor of claim 1, wherein at least a portion of the source/drain region extends outside the device region.

6. The integrated capacitor of claim 1, wherein the gate insulator is silicon dioxide and the gate is polysilicon.

7. The integrated capacitor of claim 2, wherein the accumulation layer is formed as a result of the application of a bias between the first terminal and the second terminal.

8. The integrated capacitor of claim 7, wherein the conductivity of the accumulation layer is in parallel with the conductivity of the device region below the accumulation layer.

9. The integrated capacitor of claim 1, wherein the predetermined conductivity type is P-type.

10. An integrated circuit comprising the integrated capacitor of claim 1.

11. An integrated capacitor comprising:
a gate, the gate forming a first capacitor plate;
a gate oxide disposed under the gate;
a N-type device region, the device region disposed under the gate oxide so that at least a portion of the device region is contiguous to the gate oxide;
a N-type source/drain region, the source/drain region having a doping concentration that is higher than the doping concentration of the device region; and
an accumulation layer at a surface of the device region, the accumulation layer forming a second capacitor plate;
a first terminal coupled to the source/drain region; and
a second terminal coupled to the gate.

12. The integrated capacitor of claim 11, further comprising spacers formed adjacent to the sidewalls of the gate, wherein the source/drain region includes a lightly doped region aligned with sidewalls of the gate and a heavily doped region aligned with spacers.

13. The integrated capacitor of claim 11, wherein the source/drain region is surrounded by the device region.

14. The integrated capacitor of claim 11, wherein at least a portion of the source/drain region extends outside the device region.

15. The integrated capacitor of claim 11, wherein the accumulation layer is formed as a result of the application of a negative bias at the first terminal with respect to the second terminal.

16. The integrated capacitor of claim 15, wherein the conductivity of the accumulation layer is in parallel with the conductivity of the device region below the accumulation layer.

17. An integrated capacitor comprising:
a gate, the gate forming a first capacitor plate;
a gate oxide disposed under the gate;
a P-type device region, the device region disposed under the gate oxide so that at least a portion of the device region is contiguous to the gate oxide;
a P-type source/drain region, the source/drain region having a doping concentration that is higher than the doping concentration of the device region; and
an accumulation layer at a surface of the device region, the accumulation layer forming a second capacitor plate;
a first terminal coupled to the source/drain region; and
a second terminal coupled to the gate.

18. The integrated capacitor of claim 17, further comprising spacers formed adjacent to the sidewalls of the gate, wherein the source/drain region includes a lightly doped region aligned with sidewalls of the gate and a heavily doped region aligned with spacers.

19. The integrated capacitor of claim 17, wherein the source/drain region is surrounded by the device region.

20. The integrated capacitor of claim 17, wherein the accumulation layer is formed as a result of the application of a positive bias at the first terminal with respect to the second terminal.

21. The integrated capacitor of claim 20, wherein the conductivity of the accumulation layer is in parallel with the conductivity of the device region below the accumulation layer.

\* \* \* \* \*